(12) United States Patent
Madocks

(10) Patent No.: US 7,294,283 B2
(45) Date of Patent: Nov. 13, 2007

(54) PENNING DISCHARGE PLASMA SOURCE

(75) Inventor: John Madocks, Tucson, AZ (US)

(73) Assignee: Applied Process Technologies, Inc., Tucson, AZ (US)

(*) Notice: Subject to any disclaimer, the term of this patent is extended or adjusted under 35 U.S.C. 154(b) by 788 days.

(21) Appl. No.: 10/475,548

(22) PCT Filed: Apr. 10, 2002

(86) PCT No.: PCT/US02/11473

§ 371 (c)(1),
(2), (4) Date: Oct. 20, 2003

(87) PCT Pub. No.: WO02/086185

PCT Pub. Date: Oct. 31, 2002

(65) Prior Publication Data

US 2004/0149574 A1    Aug. 5, 2004

Related U.S. Application Data

(60) Provisional application No. 60/285,364, filed on Apr. 20, 2001, provisional application No. 60/285,360, filed on Apr. 20, 2001, provisional application No. 60/285,361, filed on Apr. 20, 2001.

(51) Int. Cl.
*C23C 14/35* (2006.01)
*C23C 16/00* (2006.01)

(52) U.S. Cl. ............... 216/67; 156/345.43; 156/345.45; 156/345.46; 156/345.47; 427/569; 427/251; 427/255.5; 118/723 E; 118/718; 118/719; 204/192.1; 204/192.12; 204/298.23; 204/298.24; 204/298.31; 204/298.34

(58) Field of Classification Search ............. 204/192.1, 204/192.12, 298.23, 298.24, 298.31, 298.34; 118/719, 718, 723 E; 427/569, 251, 255.5; 156/345.43, 345.45, 345.46, 345.47; 216/67
See application file for complete search history.

(56) References Cited

U.S. PATENT DOCUMENTS 2,146,025 A    2/1939    Penning (Continued)

FOREIGN PATENT DOCUMENTS

EP    0564 082    5/1997

OTHER PUBLICATIONS

J. Reece Roth, "Industrial Plasma Engineering, vol. 1: Principles," pp. 334-337, Figure 9.31, IOP Publishing, Ltd. 1995.

(Continued)

*Primary Examiner*—Rodney G. McDonald
(74) *Attorney, Agent, or Firm*—Lawrence R. Oremland, P.C.

(57) ABSTRACT

The preferred embodiments described herein provide a Penning discharge plasma source. The magnetic and electric field arrangement, similar to a Penning discharge, effectively traps the electron Hall current in a region between two surfaces. When a substrate (10) is positioned proximal to at least one of the electrodes (11, 12) and is moved relative to the plasma, the substrate (10) is plasma treated, coated or otherwise modified depending upon the process gas used and the process pressure. This confinement arrangement produces dramatic results not resembling known prior art. Using this new source, many applications for PECVD, plasma etching, plasma treating, sputtering or other plasma processes will be substantial improved or made possible. In particular, applications using flexible webs (10) are benefited.

34 Claims, 12 Drawing Sheets

U.S. PATENT DOCUMENTS

| | | |
|---|---|---|
| 4,356,073 A | 10/1982 | McKelvey |
| 4,407,894 A | 10/1983 | Kadokura et al. |
| 4,445,997 A | 5/1984 | McKelvey |
| 4,576,700 A | 3/1986 | Kadokura et al. |
| 4,624,767 A | 11/1986 | Obinata |
| 4,631,106 A | 12/1986 | Nakazato et al. |
| 4,761,219 A | 8/1988 | Sasaki et al. |
| 4,767,516 A | 8/1988 | Nakatsuka et al. |
| 4,784,739 A | 11/1988 | Kadokura et al. |
| 4,842,683 A | 6/1989 | Cheng et al. |
| 4,842,708 A | 6/1989 | Kadokura et al. |
| 4,863,756 A | 9/1989 | Hartig et al. |
| 4,874,497 A | 10/1989 | Matsuoka et al. |
| 4,963,524 A | 10/1990 | Yamazaki |
| 5,000,834 A | 3/1991 | Yoshikawa |
| 5,099,790 A | 3/1992 | Kawakami |
| 5,135,819 A | 8/1992 | Ito et al. |
| 5,224,441 A | 7/1993 | Felts et al. |
| 5,328,583 A | 7/1994 | Kameyama et al. |
| 5,364,665 A | 11/1994 | Felts et al. |
| 5,437,725 A | 8/1995 | Schuster et al. |
| 5,527,394 A | 6/1996 | Heinrich et al. |
| 5,627,435 A | 5/1997 | Jansen et al. |
| 5,874,807 A | 2/1999 | Neger et al. |
| 5,900,284 A | 5/1999 | Hu |
| 5,945,008 A | 8/1999 | Kisakibaru et al. |
| 6,110,540 A | 8/2000 | Countrywood et al. |
| 6,156,172 A | 12/2000 | Kadokura et al. |
| 6,911,779 B2 * | 6/2005 | Madocks ............... 315/111.21 |

OTHER PUBLICATIONS

Musil, et al., "Unbalanced magnetrons and new sputtering systems with enhanced plasma ionization," American Vacuum Society, Journal of Vacuum Science and Technology A 9 (3) May/Jun. 1991, pp. 1171-1177.

Izu, et al., "High Performance Clear Coat Barrier Film," Society of Vacuum Coaters, 1993, pp. 333-340.

Horwitz, "Hollow Cathode Etching and Deposition," Handbook of Plasma Processing Technology, Noyes Publication, 1990, pp. 308-314.

* cited by examiner

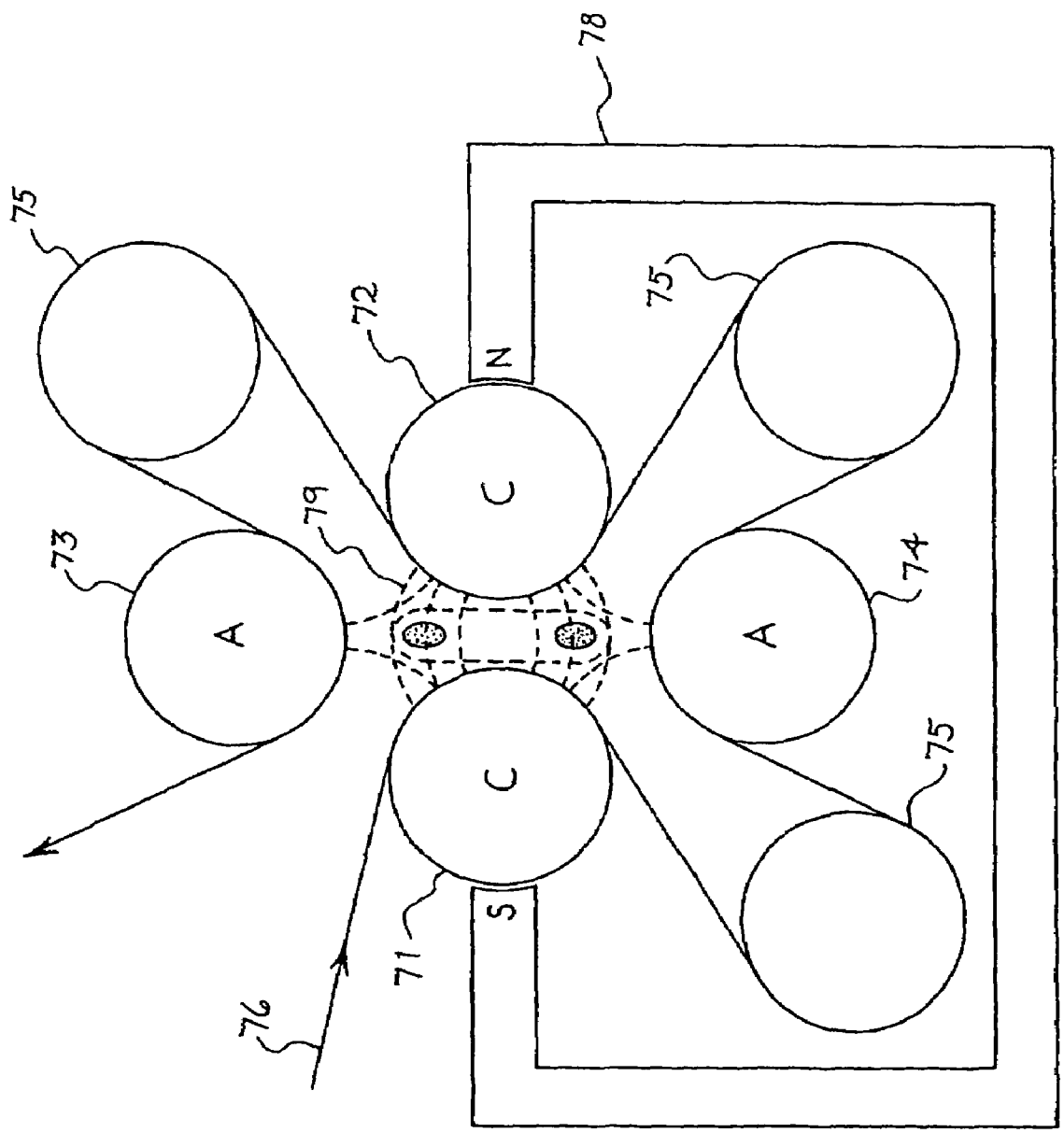
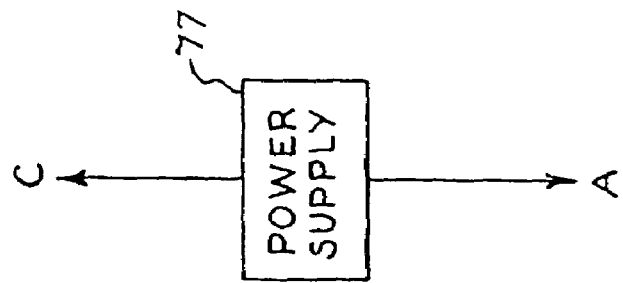
Fig. 4

PENNING DISCHARGE PLASMA SOURCE

CROSS REFERENCE TO RELATED APPLICATIONS

The present patent application claims the benefit of the filing date of U.S. provisional patent applications Ser. Nos. 60/285,360; 60/285,361; and 60/285,364, each of which was filed on Apr. 20, 2001 and each of which is hereby incorporated by reference.

This application also incorporates by reference PCT applications Ser. Nos. PCT/US02/11542 and PCT/US02/11541, both of which designate the U.S. and are being filed on the same date as the present application.

BACKGROUND

The present invention relates to a Penning discharge plasma source. Before turning to the detailed description of the presently preferred embodiments, related prior art is discussed below. The related prior art is grouped into the following sections: magnetic confinement and the Penning cell source, facing target sputtering, and plasma treatment with a web on a drum. Other prior art methods and apparatuses are also discussed.

Magnetic Confinement and the Penning Cell Source

U.S. Pat. No. 2,146,025 to Penning discloses the first use of magnetic fields to enhance and confine a plasma for sputtering. The devices shown in Penning form the foundation for much of the future magnetically enhanced plasma source work. In several configurations shown, a magnetic field is used to extend the path length of electrons as they travel from the cathode to the anode. In extending the path length, the likelihood of a collision with a neutral atom and the creation of an ion and an additional electron increases. Penning uses this effect to achieve high rate sputtering of a cathode surface (or cathode erosion as he describes it). The source in FIGS. 5 and 6 in Penning is termed a Penning Cell or a Penning Discharge. Versions of this have been used to make ion beam sources, getter vacuum pumps, and other sources. In the figures, the magnetic field is a solenoid type field, stronger in the center of the gap than at the two cathode surfaces.

Magnetically confined plasmas are also discussed in J. Reece Roth, *Industrial Plasma Engineering, Volume 1: Principles*, IOP Publishing, Ltd. 1995. Section 9.5.5 pp 334-337 of this reference presents several Penning discharge configurations. One configuration, termed a Modified Penning Discharge, uses a mirror magnetic field to further improve the containment of electrons and ions. In Roth's work, sufficient magnetic field strength is used to contain ions as well as electrons.

Facing Target Sputtering

The following patents and reference disclose a method and apparatus implementing a sputtering technique where two cathodes face each other and a magnetic field is created normal to the surface of the cathodes: U.S. Pat. Nos. 4,407,894; 4,576,700; 4,767,516; 4,784,739; 4,842,708; 4,963,524; 5,000,834; 5,135,819; 5,328,583; 6,156,172; and Musil et al., *Unbalanced magnetrons and new sputtering systems with enhanced Plasma ionization*, American Vacuum Society, Journal of Vacuum Science and Technology A 9 (3) May/June 1991. In most of these documents, the substrate is placed outside of the gap between the cathode surfaces. For example, U.S. Pat. No. 4,767,516 to Nakatsuka et al. shows facing target sources used to coat web. The substrate is parallel to the magnetic field axis and outside the plasma region.

U.S. Pat. No. 4,963,524 to Yamazaki shows a method of producing superconducting material. An opposed target arrangement is used with the substrate positioned between the electrodes in the magnetic field. The difference is that the substrates shown here are in the middle of the gap. Testing shows this does not work well. The Hall current generated within the magnetic field tends to be distorted and broken when substrates are placed where shown in this patent. When this happens, the plasma is extinguished and/or the voltage is much higher.

In the article by Musii et al., several plasma sources are reviewed. Two figures, FIGS. 1*e* and *f*, show opposed target arrangements. In the text, it describes either placing substrates out of the plasma or close to the plasma depending upon the level of bombardment desired.

Plasma Treatment with a Web on a Drum

In U.S. Pat. Nos. 5,224,441 and 5,364,665 to Felts et al., a flexible substrate is disposed around an electrified drum with magnetic field means opposite the drum behind grounded shielding. In this arrangement, the shield opposite the drum is either grounded or floating. The magnet and electrode configuration also does not lend itself to effectively contain electron Hall currents. Note that in this patent, as the shield surface is coated, the overall system capacitance decreases, changing the circuit impedance. Shield coating is also a maintenance problem in a production operation. To exemplify the scale of the potential shield coating, if a 90 cm diameter roll of 12 um polymer film (approximately 50,000 meters of film) is coated with a 30 nanometer thick coating, assuming the shield opposite the substrate receives an equal amount of coating, then the shield will collect a >2 mm thick polymer coating by the end of the run.

In U.S. Pat. No. 6,110,540 to Countrywood et al., a disclosure is made regarding the electrified drum technology referenced above. The problem of electrode coating is acknowledged in this patent. A method to maintain the conductivity of the non-drum electrode is disclosed. One issue with this solution is that, since polymerization occurs wherever there is glow, the glow at the gas feed electrode will be a high rate polymerization site causing additional maintenance headaches.

The problem of coating non-substrate surfaces is addressed in U.S. Pat. No. 4,863,756 to Hartig et al. In this disclosure, the substrate is continuously moved over a sputter magnetron surface with the surface facing the magnetron located inside the dark space region of the cathode. In this way, the magnetic field of the magnetron passes through the substrate and is closed over the substrate surface constricting the plasma onto the surface. The problem with this method is the substrate on the magnetron effectively becomes a sputtering target and receives intense ion bombardment. Therefore, while a PECVD film is being deposited on the substrate, the intense ion bombardment is simultaneously ablating the film. Another difficulty is that due to the intense ion bombardment, the substrate can become very hot. This limits substrate materials options and requires the substrate move at a speed sufficient to prevent damage from overheating. This limits the application options for this device.

Other Prior Art Methods and Apparatus

U.S. Pat. No. 4,761,219 to Sasaki et al. shows a magnetic field passing through a gap with the wafer on one electrode surface. In this case, the electrodes are opposed to each other.

U.S. Pat. No. 5,099,790 to Kawakami shows a microwave source with a moving magnet below the wafer to even out the coating on the wafer. In another figure, the substrates are moved over a stationary magnet(s). This source does not have opposed cathode (electrode) surfaces.

SUMMARY

The present invention is defined by the following claims, and nothing in this section should be taken as a limitation on those claims.

By way of introduction, the preferred embodiments described below relate to a Penning discharge plasma source. In one preferred embodiment, a plasma treatment apparatus is provided comprising: at least two surfaces with a gap between the surfaces, wherein both surfaces are connected as electrodes; at least one magnetic field extending between the surfaces through the gap; at least one anode structure disposed around the at least one magnetic field creating diverging electric fields inside the at least one magnetic field to form a closed loop Hall current containment region within the at least one magnetic field, where upon with sufficient gas pressure and voltage between the electrodes and the anode structure, a plasma is formed in the containment region; and at least one continuously moving substrate positioned to be treated by the plasma, wherein the at least one continuously moving substrate is supported on at least one plasma facing surface and wherein at least one surface of the at least one continuously moving substrate is positioned between the plasma and the at least one plasma facing surface.

Other preferred embodiments are provided, and each of the preferred embodiments can be used alone or in combination with one another. The preferred embodiments will now be described with reference to the attached drawings.

BRIEF DESCRIPTION OF THE DRAWINGS

FIG. 4 shows a section view of a web apparatus wherein both cathode and anode electrodes are covered by the substrate.

DETAILED DESCRIPTION OF THE PRESENTLY PREFERRED EMBODIMENTS

Figure 1:
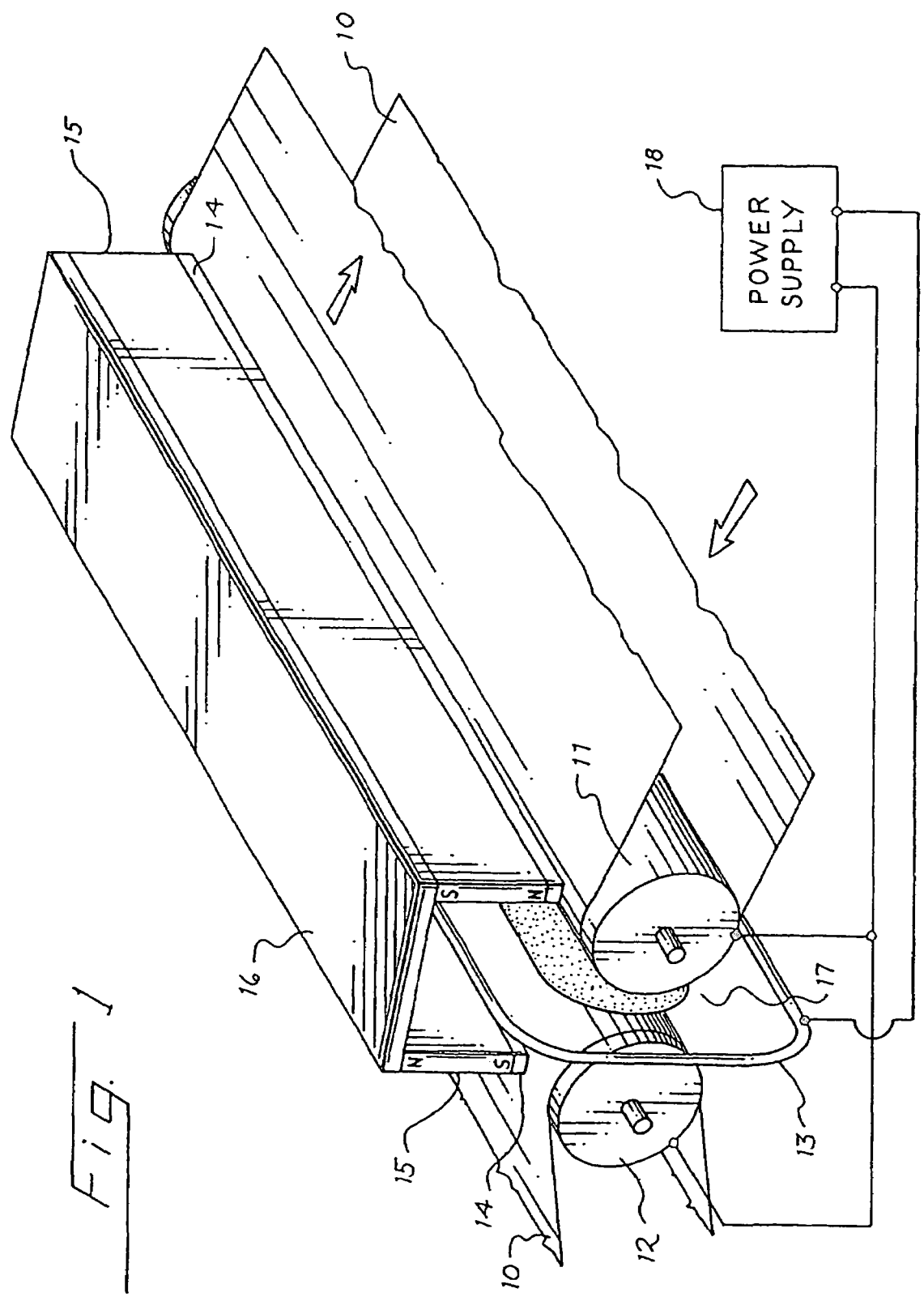
FIG. 1 shows an isometric view of a flexible web apparatus of a preferred embodiment.

FIG. 1 is an isometric view of a continuous web application of a preferred embodiment. A web 10 of flexible material is disposed around conveyor rolls 11 and 12. Web 10 can be either two separate materials or one continuous web substrate conveyed from roll 11 to roll 12 with idler rolls not shown. Conveyor rolls 11 and 12 are constructed of a high permeability material such as carbon steel and are fabricated of sufficient thickness to carry a magnetic field. Conveyor rolls 11 and 12 are connected to one side of power supply 18 and form one electrode of the electric circuit. The power supply 18 should be a pulsed DC or AC supply to capacitively couple power though the web substrate if the substrate is a dielectric material. The second electrode is an annular member 13 positioned roughly equidistant from the center of the gap between rolls 11 and 12. A magnetic field is created across the gap between rolls 11 and 12 with permanent magnets 15 and magnetic shunts 14 and 16. The magnetic field strength between rolls 11 and 12 must be sufficient to magnetize electrons at least in a portion of the magnetic mirror between the rolls 11 and 12. Pole pieces 14 are disposed a small distance from rolls 11 and 12 such that the distance is less than the plasma dark space sheath distance. Pole pieces 14, magnets 15 and magnet shunt 16 are not connected to power supply 18. The assembly is located in a vacuum chamber (not shown). Process gases are supplied into the vicinity of the source at a total pressure of approximately 1-100 mTorr by known techniques. When power supply 18 is turned on, a plasma 17 is struck in the gap between the rolls 11 and 12. Approximately 300V-800V is required, similar to a magnetron sputter cathode. The plasma is magnetically confined in this preferred embodiment to a region between the two roll surfaces covered by the web substrate. The advantage of this apparatus is that the plasma is contained proximal to the continuously changing web material and therefore the web receives the bulk of PECVD coating, plasma treatment or other plasma process. The capacitance of the first electrode (cathode) does not change because the coating does not accumulate on the conveyor rolls. Coating on the second electrode (anodes) and other parts of the apparatus is reduced because they are relatively distant from the plasma. Note that conveyor rolls 11 and 12 and electrode 13 can be water cooled using known techniques. Though the ion bombardment of the substrate on the rolls is reduced, for typical industrial uses involving extended operation times, water cooling will be required.

Figure 2:
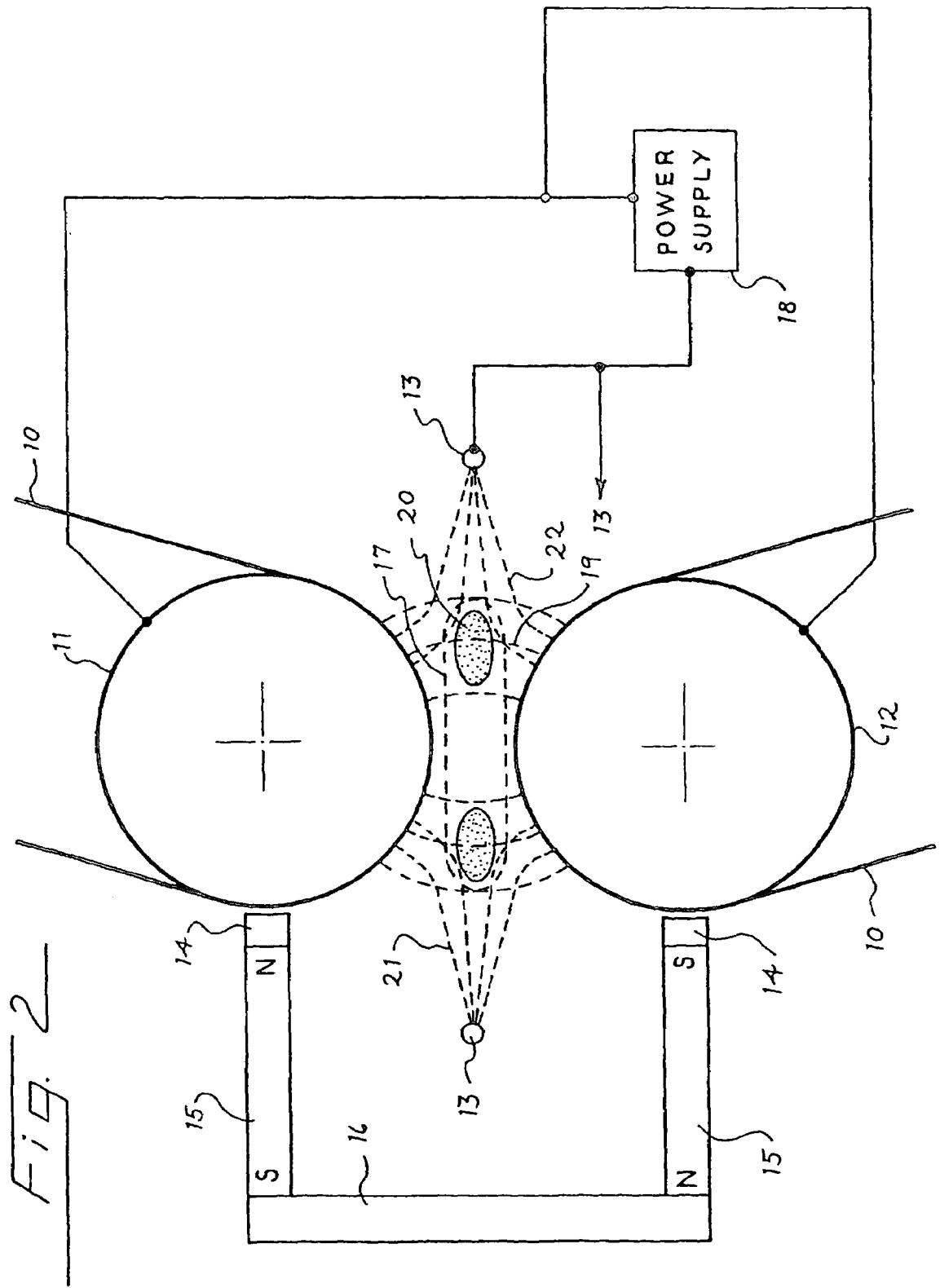
FIG. 2 shows a section view of the web apparatus of FIG. 1 with magnetic and electric field lines illustrated.

FIG. 2 is a section view of the web coating source of FIG. 1. As described in FIG. 1, continuous flexible web material 10 is disposed around conveyor rolls 11 and 12. A magnetic field 19 is created across the gap between rolls 11 and 12 by permanent magnets 15, magnetic shunt 16 and pole pieces 14. As stated above, the magnetic field must be strong enough to magnetize the electron population. This means the minimum field strength at the center of the gap where the magnetic field is weakest must exceed 50 gauss. Typically the field strength should exceed 100 gauss. There is no practical top limit. Use of high strength magnets readily produces field strengths in excess of 1000 gauss at the center of the gap. At these higher strengths, ions, to some extent, are also magnetized. The Penning discharge type containment implemented here has the advantage that a surface does not interfere with electron and ion gyro paths within the contained plasma volume. Therefore ions with their larger gyro radii can be contained. In all the figures in this application, ceramic ferrite magnets were used producing field strengths ranging from 300-800 gauss in the center of the gap. Other means to produce the required magnetic dipole field such as rare earth magnets, soft ferrite magnets, AlNiCo magnets or electro magnets can be used to produce similar results. Note that the magnetic field widens in the gap between rolls 11 and 12 forming magnetic mirrors at each roll surface.

Electric fields 21 are created between conveyor roll electrodes 11 and 12 and annular electrode 13 by power supply 18. Electric field 21 and 22 potential lines penetrate into the gap between rolls 11 and 12 producing field lines 21 and 22 that cross magnetic field 19 lines. This geometry produces a closed loop Hall current trap 20 normal to the magnetic field. To explain in more detail, an electron near one negatively charged roll electrode surface will attempt to escape along the electric field lines 21 or 22. The electric field lines 21 and 22 emanate from web surface 10 on rolls 11 and 12 and begin curving away from the gap between the roll surfaces. Toward the center of the gap, electric fields 21 and 22 begin to converge and at the same time cross the magnetic field 19. The electron, while initially able to move away from the cathode surface, becomes trapped in the converging electric fields and now crossing magnetic field toward the center of the gap. It is important to note that not only are the electrons trapped in the plane of this section view, but they are also trapped in the third dimension into and out of the paper. This occurs because electric fields 21 and 22 continue to cross magnetic field 19 completely around magnetic field 19. As the Hall current flows into and out of the paper, this current is confined to region 20 in an endless loop. This produces an efficient electron confinement and a ring of intense plasma 20 between the two roll electrode web surfaces inside the magnetic field 19.

Once this fundamental method of electron containment within a dipole magnetic field is understood, many different configurations are possible that result in several important beneficial outcomes. Two of these benefits are that a uniform plasma is created over wide substrate widths and that ion bombardment of the web is reduced compared to sources where the substrate forms the target in a magnetron sputter arrangement, such as the one disclosed in U.S. Pat. No. 4,863,756 to Hartig et al. Lower ion bombardment rates reduce substrate heating and ablation. More benefits are described throughout this application.

As stated above, when voltage is applied between roll surfaces 11 and 12 covered by web 10 and electrode structure 13, an intense plasma ring 20 is generated. The voltage and the frequency required will depend upon the substrate used and process conditions. For example, for the figures depicted, a 50 kHz to 460 kHz plasma power supply was used. A transformer type matching network with an 8:1 turn ratio was used to increase the voltage at the electrodes. The source rolls were 6" long with the different magnet configurations implemented. Power supply output powers ranged from 100-500 watts. Earlier work was done with 3" long rolls and lower powers. From all indications, extending the source has no limitations. Similar to a planar magnetron source, the confined Hall current race track can be extended out to substrate widths of several meters. Note that with conducting substrates such as metal sheet, DC power can be used. Radio frequency is also an option (13.56 MHz). Part of the advantage of the invention is that the efficient electron containment produces a relatively low impedance plasma allowing frequencies lower than 13.56 MHz to be used at low pressures (10 mTorr). Lower frequency power supplies are generally lower cost and the total circuit produces less noise. Inside the vacuum chamber, lower frequencies also produce less spurious plasma. Lower frequency systems are also generally safer. Though lower frequencies are suggested, this should not limit the invention to these frequencies. Higher frequency operation will also benefit from the electron containment schemes presented.

If a DC source is used with a conductive substrate 10 supported by electrode rolls 11 and 12, the negative electrode can be connected to the rolls or to the substrate directly via a sliding brush or other known method. The substrate then is definitively the cathode and the positive terminal is connected to anode 13. Using AC or RF, the terms anode and cathode have less meaning. The rolls and surrounding "anode" have been termed electrodes herein to use more general terms related to AC circuits. For the figures depicted, the surrounding electrode 13 is connected to ground.

As the power is raised to the source, the plasma expands beyond ring 20 and fills the region between the roll surfaces with plasma cloud 17. In terms of ion sources, the lower power mode where the Hall current ring can be seen correlates to the collimated mode. As the power is raised, with the pressure in the mTorr range (1-100 mTorr), the contained plasma volume shifts into the diffuse mode. The diffuse mode may be regarded as the operation mode of the source. In this mode, the electric fields are no longer paths from one electrode to the opposed electrode. The plasma cloud becomes conductive, and the typical abnormal glow plasma potential applies. The collimated mode fields and electron motion are described to communicate the underlying operating principle of endless Hall current confinement within a simple dipole magnetic field. When one of the sources depicted is operated in the lower power collimated mode and the Hall current ring is clearly visible, the inventive method can be readily understood as can the extendibility of this method to a myriad of dipole, Penning type configurations. In the diffuse mode, while not visible, the Hall current confinement is still operating, producing a confined, low pressure, low impedance plasma.

Note that electrode 13 does not have to be continuous to create the described Hall current containment electric fields that circumvent the magnetic field. A segmented or partial electrode must only have sufficient presence around the magnetic field to create continuous electric fields. The reason for this is the extreme mobility of electrons once free of the confining magnetic field. For instance, in the source depicted in FIGS. 1 and 2, if shunt 16 was connected as the only anode electrode opposite rolls 11 and 12, the electric field would still circumvent and penetrate the entire magnetic field per the inventive method. Even in a long, 2 meter source, once outside the constraining magnetic field, electrons would easily find their way to shunt 16.

Figure 3:
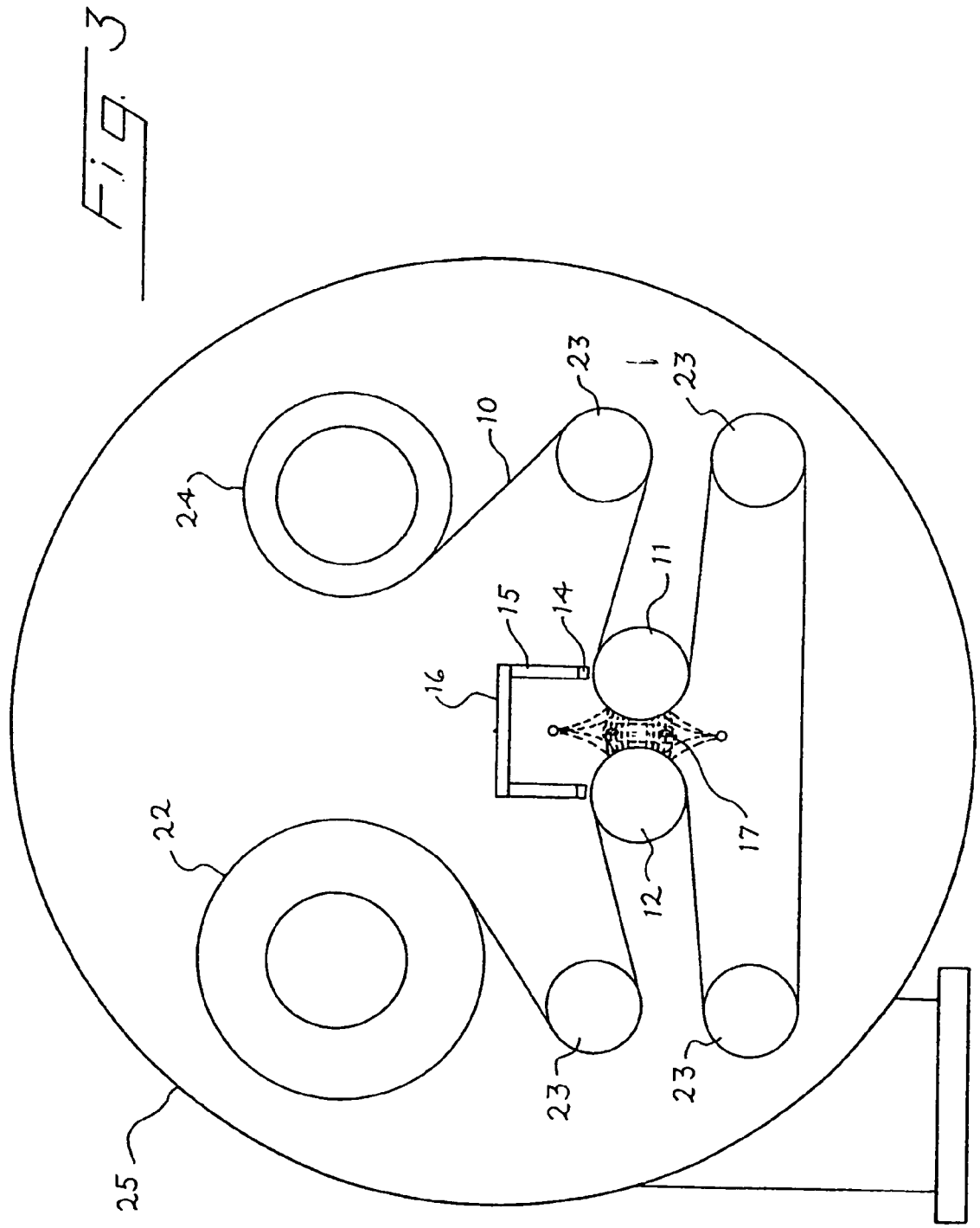
FIG. 3 shows the web apparatus of FIG. 1 inside a vacuum chamber.

FIG. 3 shows a section view of the web coating plasma apparatus of FIGS. 1 and 2 inside a vacuum chamber 25. A schematic web path comprises unwind roll 22, idler rolls 23 and rewind roll 24.

FIG. 4 shows a section view of a web coating apparatus similar to FIGS. 1 and 2. In this embodiment, both electrode poles are covered by the web substrate. Using this electrode arrangement along with idler rolls 75 (and possibly web aligning equipment not shown), deposition on the electrodes is largely eliminated. Since the glow is in contact with only the substrate, material usage is maximized as is power efficiency while maintenance is minimal. Note that by moving anode rolls 73 and 74 closer or farther away from the plasma, plasma contact, contact energies and the overall shape of the plasma can be altered. Power supply 77 is connected between electrode rolls 71 and 72 and opposite electrode rolls 73 and 74. The magnetic field 79 is created in the gap with an assembly of permanent magnets and magnetic shunts 78. Another alternative connection arrangement is to connect the power supply to idler rolls 75 rather than rolls 73 and 74 making idler rolls 75 serve as the opposite electrode. Then rolls 73 and 74 are left to electrically float. Either of these configurations is useful when an electrically isolating film such as SiOx is deposited by PECVD. By covering the plasma exposed surfaces with the substrate, long runs can be made without the process parameters changing due to buildup on the electrodes.

Figure 5:
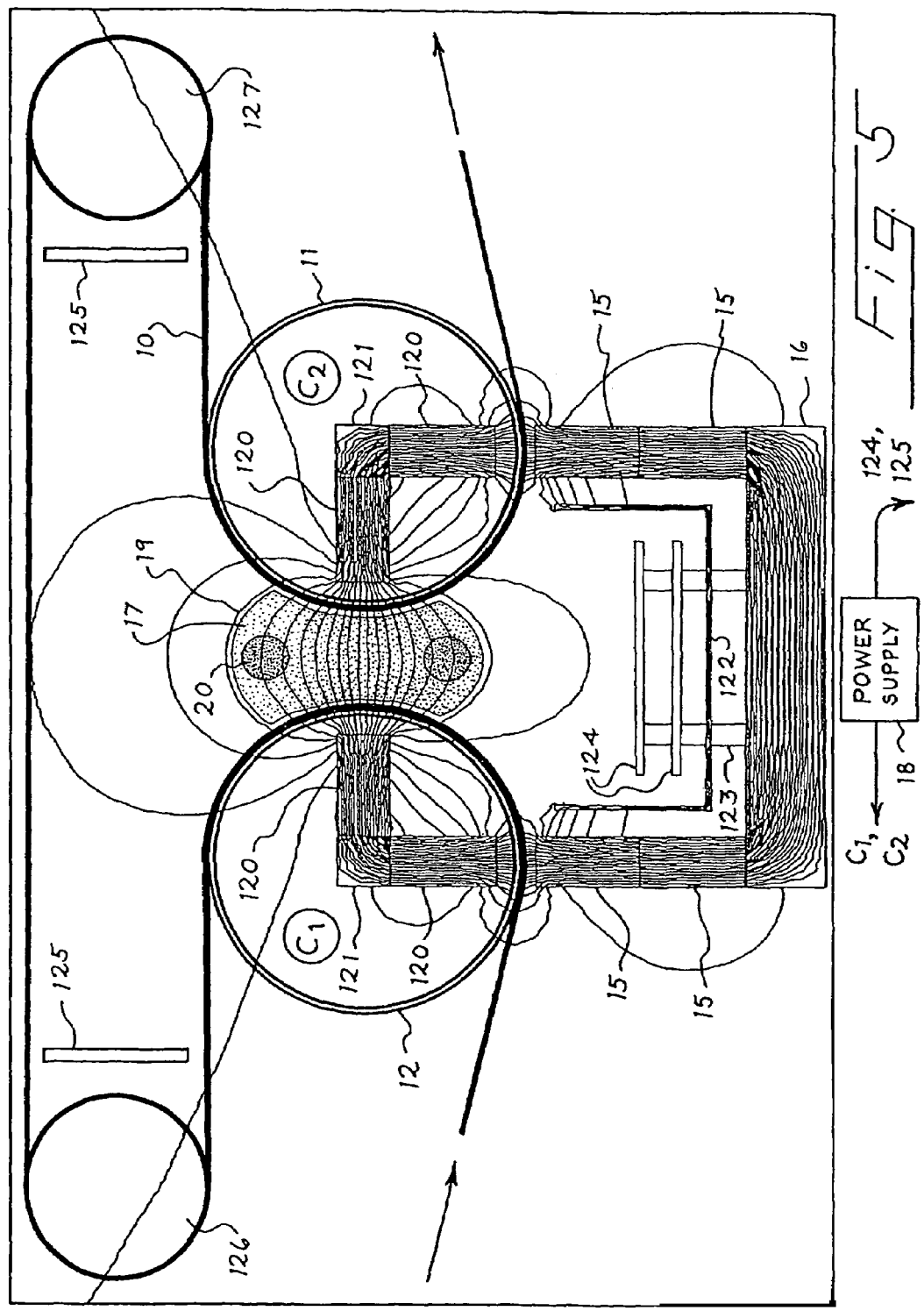
FIG. 5 shows a section view of a flexible web apparatus employing a thin sheet metal shunt to collect stray magnetic field.

FIG. 5 shows a section view of another embodiment of a web coating apparatus. In this embodiment, the substrate supporting electrode rolls 11 and 12 are hollow and made of a non-magnetic material such as stainless steel (300 series). Internal to rolls 11 and 12, magnets 120 and roll shaft shunt 121 carry the magnetic field from magnets 15 and shunt 16 to create gap field 19. This is different than the earlier depictions that used a permeable material roll. While more complicated, the advantage of internal magnets is the gap field 19 tends to be better defined, and the magnet length can be tailored to the desired web width. For instance, if the rolls are a constant 64 inches wide, the magnets can be 58 inches long for a 60 inch web width. Plasma is then concentrated over the roll region covered by web, and the ends of the roll receive less coating. Magnetic field shunt 122 collects stray field from the region between magnets 15. This helps to further define mirror magnetic field 19 and to contain plasma 17 into the region between roll electrodes 11 and 12. Idler rolls 126 and 127 route the web from roll 11 to roll 12. Since web 10 "sees" the plasma as the web passes from idler roll 126 to 127, additional treatment, coating, etc. is accomplished. In this apparatus, an alternating current power supply 18 is connected to both rolls as one electrode and to conductive surfaces 124 and 125 as the other. The frequency of the AC must be sufficient to capacitively couple though web 10. For packaging type PET flexible web, the frequency must be above 20 kHz. Frequencies up to and beyond 13.56 MHz may be used with success although an advantage of the inventive method is that because of the efficient Hall current confinement, lower "mid-frequency" frequencies from 40-500 kHz may be used. Power supplies at these lower frequencies tend to radiate less, and load matching can be accomplished with simple transformer type networks. Both 124 and 125 have conductive surfaces not facing the plasma. This helps to keep a portion of the electrodes conductive when an insulating coating is deposited.

Another feature of the inventive method is the use of a magnetic mirror field 19 between substrate supporting rolls 11 and 12. A mirror field is produced when the magnetic field strength at the surface of the substrate 10 is greater than the field in the center of the gap. The effect of a mirror field on electrons is to push the electrons into the center of the gap, away from the region of stronger field. Electrons then are constrained in three axes by the magnetic field. They are constrained from moving across magnetic field lines, and they are constrained from moving toward the roll surfaces. The result is the plasma 17 tends to be focused into the center of the gap. This has several advantages. The further constraining of electrons produces a higher-plasma "pressure" in the central plasma region as ions electrostatically are focused into the center following the electrons. Fewer ions at the surface of the substrate produce less ion bombardment of the substrate. This lowers the substrate temperature and reduces ablation of the surface. Reducing the temperature of the plasma process for a given power input has many advantages. These are detailed at the end of the detailed description section.

Note also that the conveyor rolls 11 and 12 can be moved closer together or farther apart to different effect. As the rolls are moved closer together, the electric fields have a harder time penetrating into the center of the gap. The Hall current ring 20 remains visible at higher powers, and the virtual cathode created in the center of the gap results in an ion flow into the center of the gap. Continuing to move the rolls closer together eventually extinguishes all signs of plasma in the center of the gap. If the rolls are moved too close together, the Hall current cannot move from one side of the rolls to the other, and the plasma is extinguished. This can be solved by configuring the magnets to allow the plasma to circle around the outside ends of the rolls, or the rolls can be sloped at each end to open the gap at the ends. While these variations are included within the inventive method, they are not recommended as they are more expensive or involve added complexity. The best gap between the rolls is approximately 1.25 to 2 inches given the arrangement shown in FIG. 5 with Ceramic 8 type magnets. This is small enough to maintain a strong magnetic field between the rolls while large enough to allow the Hall current to pass between the rolls at the ends. Larger rolls with more magnets or the use of rare earth magnets would allow the gap to be larger than 2 inches.

Figure 6:
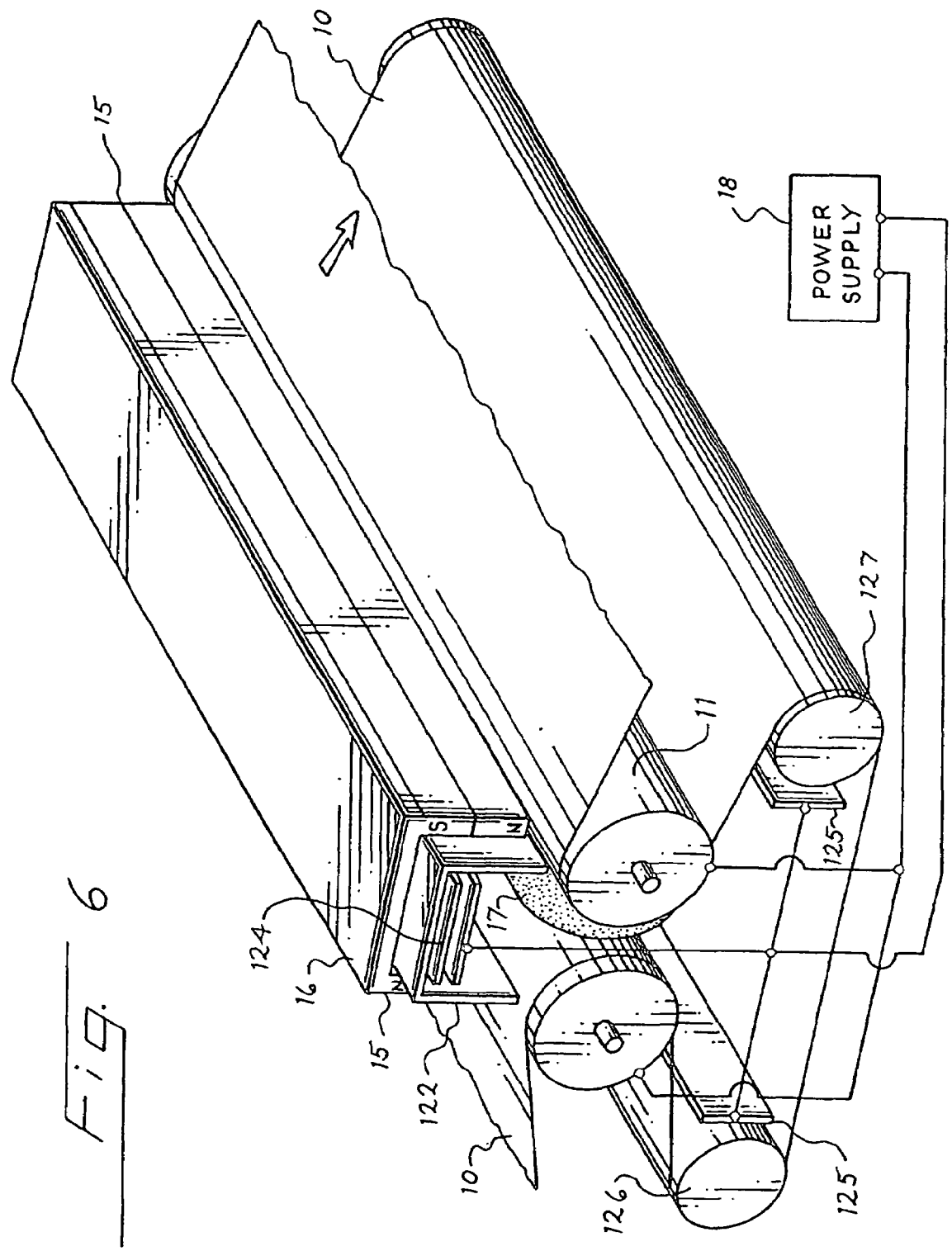
FIG. 6 shows an isometric view of the FIG. 5 source.

FIG. 6 is an isometric view of the continuous web application shown in FIG. 5. Note the high permeability shunt 122 extending from primary magnetic field path 15 and 16. Plasma can be seen between rolls 11 and 12. Even though electrodes 125 and 124 do not extend around the end of rolls 11 and 12, due to the mobility of electrons once outside the constraining magnetic field, the electric field still penetrates into the magnetic field and creates the closed Hall current containment region at the ends of the rolls.

Figure 7:
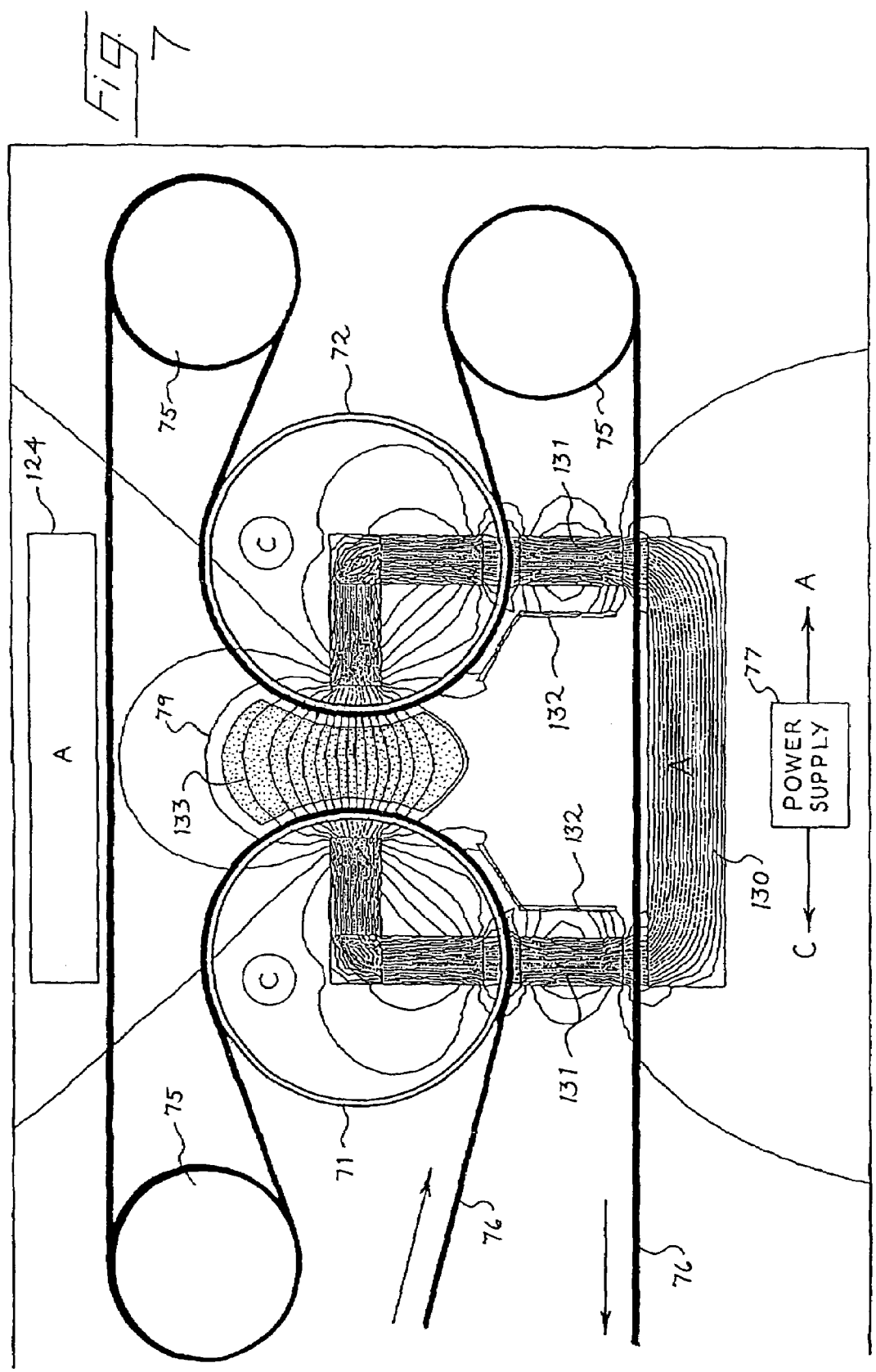
FIG. 7 shows a section view of another preferred embodiment with the flexible web covering the opposite electrode.

FIG. 7 shows a section view of another flexible web source. This source hides the A electrodes 130 and 134 behind web 76 to reduce the coating received by these electrodes. Electrode 130 also serves as the magnet shunt bringing magnetic field from roll 71 and magnet 131 to roll 72 and magnet 131. Electrode 130 and shunts 132 are made of a high permeability material. Electrode 134 can also be made of a high permeability material without effecting operation.

Figure 8:
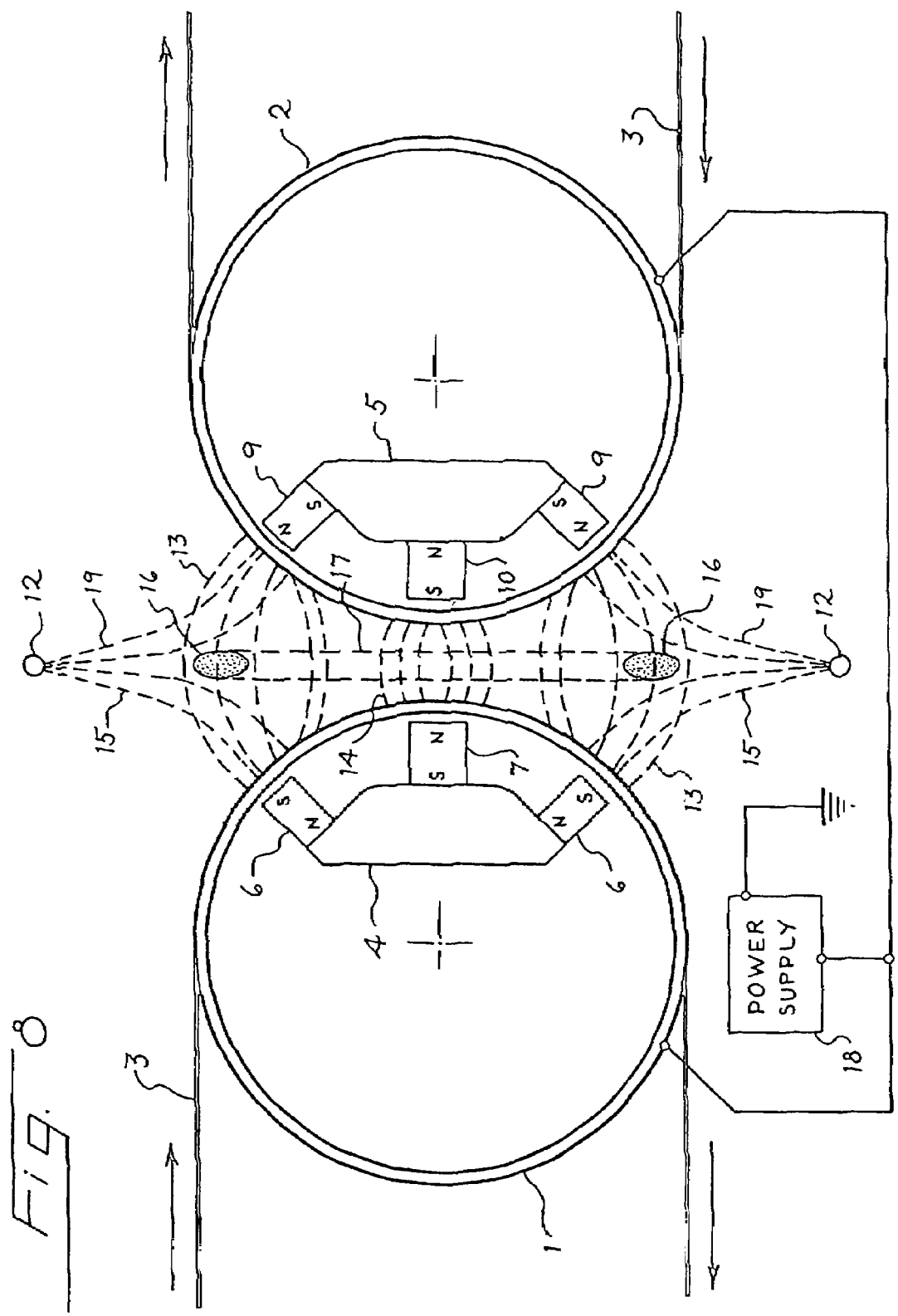
FIG. 8 shows a section view of a rotating roll source where the return magnetic field is brought through the center of the rolls instead of externally via a shunt and magnets.

FIG. 8 is a section view of a device employing an alternative embodiment. In this embodiment, electrode surfaces 1 and 2 are hollow conveyor rolls and face each other across a gap. A magnetic field 13 is formed outside the rolls in the shape of a closed loop racetrack with magnet sets 6 and 9. Rather than externally returning the magnetic field, the return magnetic field 14 is formed inside magnetic field 13 with magnets 7 and 10. Magnetic shunts 4 and 5 complete the magnetic circuit. The magnet assemblies do not turn with the conveyor rolls but remain fixed facing each other. A flexible web substrate 3 is disposed around conveyor rolls 1 and 2. The electrical circuit is formed with conveyor rolls 1 and 2 connected in parallel to power supply 18 and electrode 12 with plasma 16 completing the electrical circuit. Electrode 12 substantially circumvents the magnetic field 13 thereby creating electric fields 15 and 19 from conveyor rolls 1 and 2 surfaces to anode 12. An alternating or pulsed DC voltage is generated by power supply 18 to couple the field through web substrate 3. Electric fields 15 and 19 are parallel to the magnetic field at the substrate 3 surface and gradually become more normal to magnetic field 13 toward the center plane between the rolls 1 and 2. These diverging fields, in conjunction with magnetic field 13, form a closed loop Hall current trap 16 in magnetic field 13. An intense plasma forms in the Hall current trap 16. Note that the electric fields 15 and 19 do not penetrate fully into the gap between rolls 1 and 2. This creates a virtual cathode in this gap. Some ions created in the trap "see" this virtual cathode and accelerate into the center of the magnetic racetrack through magnetic field 14 in the center of the gap between rolls 1 and 2. Once accelerated into the gap, ions coast until colliding with another particle or encountering the decelerating fields on the opposite side of the racetrack loop. This ion current is depicted by dashed lines 17 in FIG. 8.

In operation, a process gas or combination of gases is presented to the vicinity of the conveyor rolls using known techniques for total pressures ranging from 1 to 100 mTorr. Power supply 18 is turned on, and the plasma 16 lights.

Note that the electrode 12 does not necessarily have to be continuous to create Hall current containment electric fields 15 and 19 circumventing the magnetic field 13. The important thing is to have sufficient electrode 12 presence around the magnetic field to create the continuous confinement electric fields 15 and 19.

Additionally in regard to the electrode 12, this electrode 12 can be removed and the chamber wall used as the electrode. While electrode 12 as shown will operate as described, it is an additional part and it can become coated in a PECVD operation. It is shown in FIG. 7 to assist the reader. All advantages of the preferred embodiment are maintained by using the chamber wall as the electrode 12 with the exception of the ability to direct the resulting ion current into the gap between rolls 1 and 2. As stated above, as long as electric fields 15 and 19 circumvent magnetic field 13, the electrode 12 can take a variety of forms.

While this embodiment has the advantage of no external magnets or shunts, the rolls must be positioned carefully with respect to each other to achieve the magnetic fields as shown. If the rolls are too far apart, the magnetic fields change to more closely approximate two facing magnetron sources (similar to two sources per U.S. Pat. No. 4,863,756 to Hartig et al.). If the rolls are too close together, the Hall current cannot pass through the gap between the rolls at the turnarounds at each end. As discussed earlier, alternatives are available such as allowing the Hall current to pass beyond the end of the rolls and turnaround outside the gap or the rolls may be tapered at the ends to open the gap at the turnarounds. At any rate, one should be aware of these limitations when building a source of this type.

An important aspect of the invention that differs from prior art is that the Hall current is contained between the two roll electrodes 1 and 2. In Hartig for instance, the substrate is made the target in a magnetron sputtering configuration. This results in intense ion bombardment of the substrate with the attendant high temperature load and ion ablation effects. Unlike this prior art, the inventive method contains the intense Hall current away from the surface of the substrate. While a bright plasma is formed, the ion bombardment of the substrate is reduced. This results in a lower substrate temperature allowing a wider range of substrate materials to be used along with slower conveyor speeds. Slower process speeds allow thicker coatings to be deposited. Also, ablation of the substrate is reduced.

Figure 9:
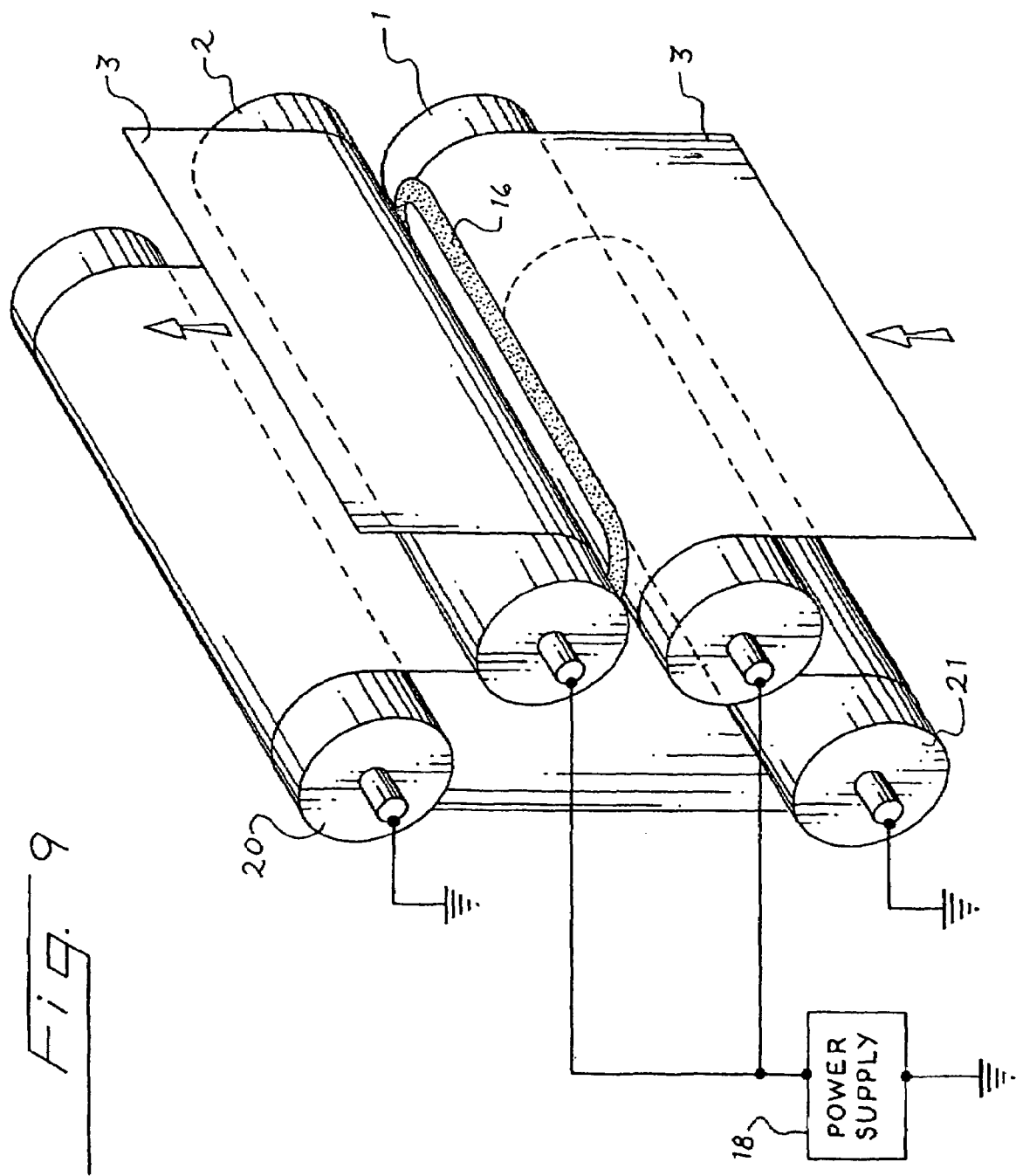
FIG. 9 is an isometric view of the FIG. 8 source.

In FIG. 9, an isometric view of the web embodiment of FIG. 8 is depicted with the chamber wall and idler rolls 20 and 21 acting as grounded electrodes. Conveyor rolls 1 and 2 are shown with web 3 disposed around the rollers. The web 3 is a continuous web with idler rolls 20 and 21 serving to convey the web between rolls 1 and 2. The plasma ring 16 is created by the inventive method between rollers 1 and 2. Note that the plasma is in close proximal contact with continuously moving web 3 while other surfaces are substantially more distant. This is a major advance in coating, etching or plasma treating web substrates. Where in the prior art, the electrodes often receive the bulk of the coating, the system of FIGS. 8 and 9 dramatically improves this situation. Other advantages evident in this figure are that the device and method can be scaled to any width required. Also, uniformity of the plasma is consistent with that achievable with magnetron sputtering. This far exceeds uniformities possible with non-magnetically enhanced RF diode discharges over wide substrates. For continuous operation in production, rolls 1 and 2 are water cooled using known techniques.

Figure 10:
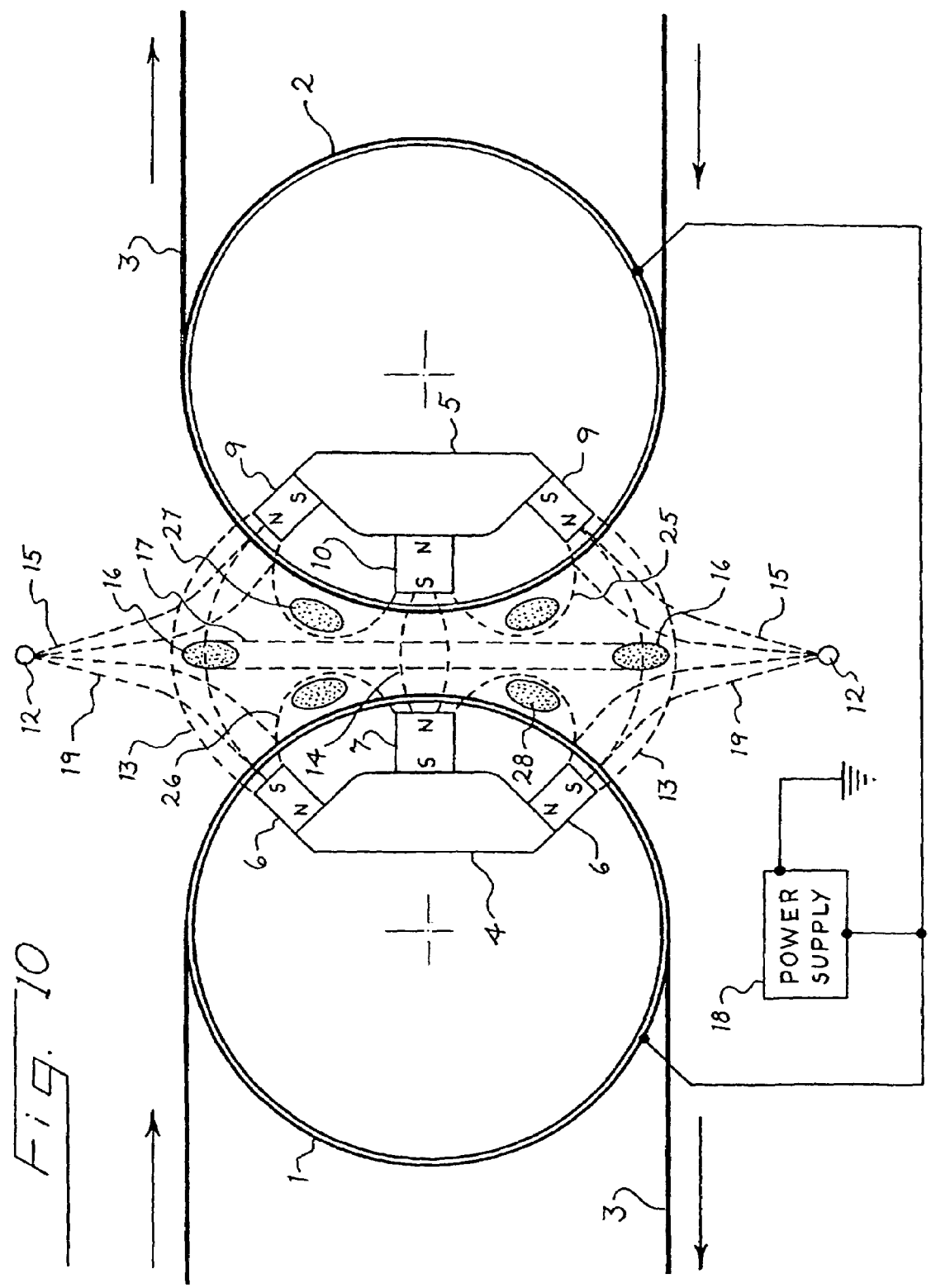
FIG. 10 is a section view depicting a variation on the FIG. 8 source.

FIG. 10. shows another embodiment of the inventive method. In this apparatus, rolls 1 and 2 are moved apart to create both closed magnetic tunnels 25 and 26 over rolls 1 and 2 and crossing magnetic fields 13 and 14. The magnetic tunnels 25 and 26 are similar to the magnetic confinement of a magnetron cathode. When process gas is supplied and power supply 18 is energized, plasma lights in the containment rings 16, 27 and 28. This effect can be adjusted by the magnetic field strength, distance between the rolls, magnet configuration, process gases and power supply settings. Many variations are possible. For instance, instead of two rolls, one cathode could be a planar magnetron. In this way, a flexible web could receive a sputter coating while also being bombarded by plasma species due to containment rings 16 and 27.

Figure 11:
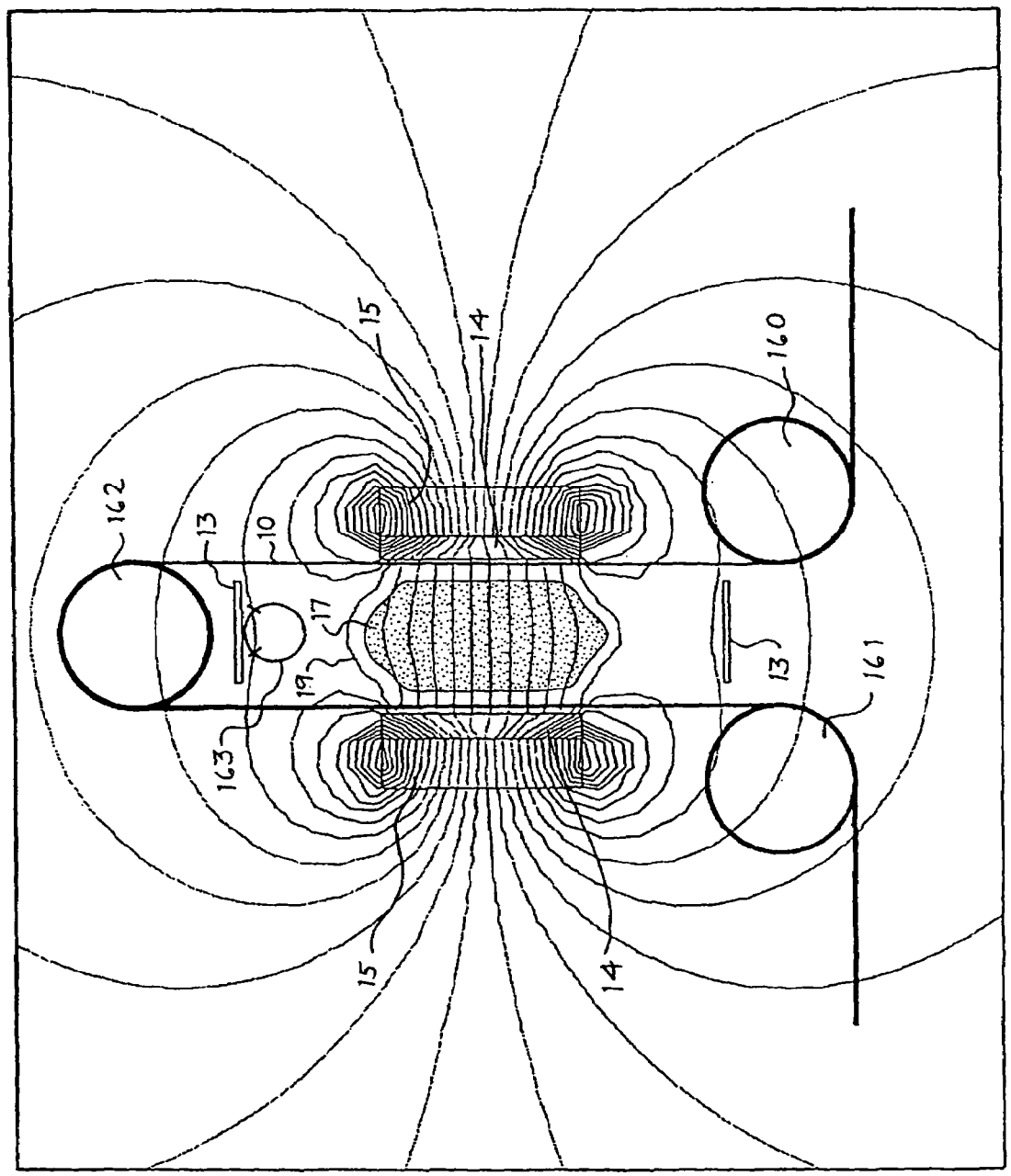
FIG. 11 is a section view of another flexible web source.

FIG. 11. shows another preferred embodiment, this one has the magnetic containment outside of the rolls. Idler rolls 160, 161 and 162 transport web substrate 10 in a path across the faces of pole pieces 14. Note that the web does not touch poles 14 but rather moves adjacent to it. The idea is to keep the web close enough to the poles 14 that plasma does not form between poles 14 and the web. In some of the following claims, it is stated that at least one surface of the substrate is positioned between the plasma and the plasma facing surface supporting the substrate. For example, in the embodiment described above, the back side of the web is between the plasma and the electrode surface. There is naturally a region without plasma near the electrode that is termed the "dark space". This is shown in this figure as excluded from the shaded plasma region 17. The dark space is a well known phenomenon. Magnets 15 produce magnetic field 19 in the gap between pole pieces 14. A power supply (not shown) is connected to poles 14 as one electrode and electrode 13. This produces the required electric fields inside the magnetic field and contained plasma region 17. Of additional note in this figure is that there is no magnet or permeable material return path for the magnetic circuit. The return path is helpful because it allows the field in the gap to be stronger and reduces spurious closed field plasma regions. While advantageous, this figure shows that it is not required for the inventive method. The process gas can be distributed to improve gas utilization and enhance process uniformity. Gas distribution tube 163 is shown attached to electrode 13. In this location, the process gas is forced to flow through the plasma on its way to the vacuum pump through the gaps in the lower electrode 13. End shield plates are not shown that prevent the gas from leaving the ends of the source. Depending upon the process type, this can lead to more efficient use of the process gasses.

Figure 12:
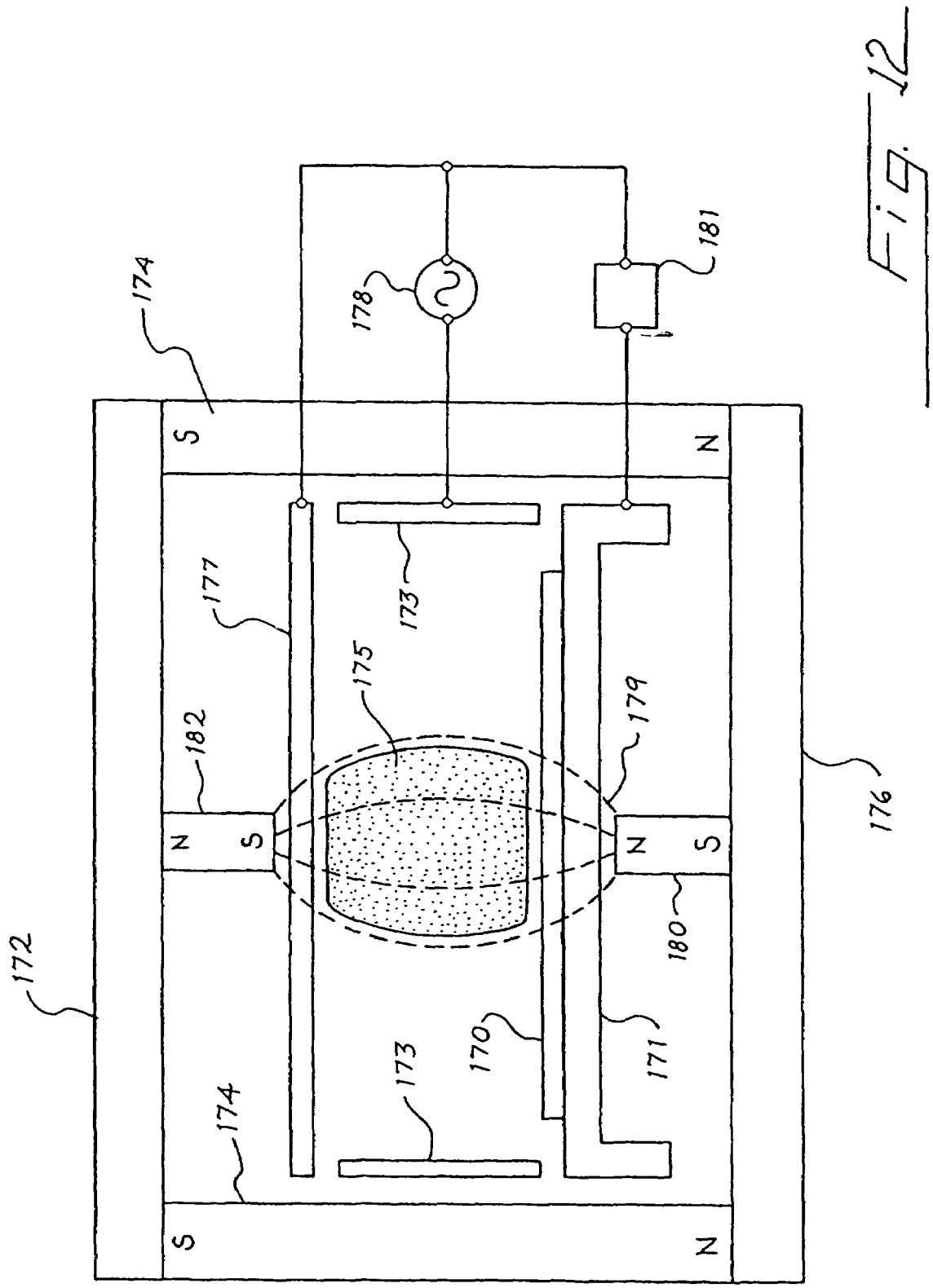
FIG. 12 is a section view of a rigid substrate (wafer) plasma source of a preferred embodiment.

All the sources shown have been adapted for flexible web type substrates. This has been done because of the commercial value of an improved web coating source and because of the requirement that the substrate become an electrode in the electric circuit. For the substrate to become an electrode in the case of an insulating substrate, the substrate must be thin enough to capacitively pass electrical current. Web substrates are typically thin enough to readily pass AC current even in the 10's of kHz. As thicker substrates are used, the AC frequency must rise up eventually to RF at 13.56 MHz. While as described above, RF 13.56 MHz presents additional challenges, it can be used in all the sources presented. FIG. 12 shows a rigid substrate source implementing the inventive method. A silicon wafer 170 is placed on platen 171. Bar magnet 180 is placed under platen 171 and extends under the wafer. A magnetic field 179 is created between the wafer surface and surface 177 with a second bar magnet 182, shunt 172, shunt 176 and magnets 174. Electrode 177 is a non-magnetic material such as copper or titanium. Electrode 177 can be fitted with a plasma facing surface that either enhances or is benign to the process. This can be important as sputtering of surface 177 does occur. Electrodes 173 are constructed of a high permeability material to capture stray magnetic field. Power supply 178 is connected to platen 171 and electrode 172 and to electrode 173 as shown. 181 is a device to control current or voltage at the wafer surface and can be inserted if needed. The resulting magnetic and electric fields result in the contained Hall current of the inventive method and produces a dense plasma 175 in the gap between wafer 170 and electrode 177. Shunts 176 and 172 and magnets 180 and 182 are rotated to uniformly plasma treat the wafer. Alternately, magnets 180 and 182 could be smaller bar magnets and could be moved in a pattern to move the plasma over the wafer surface as required. A means for detecting the completion of the process step could be used to determine when all areas of the wafer had received adequate treatment.

Note that the substrate is positioned over only one electrode in FIG. 12. This same approach can be implemented in the web based apparatus shown above. For instance, one roll could support the web substrate while the opposite electrode could be a planar sputter target. Many embodiments will be apparent to one skilled in the art. The inventive method presents a fundamentally novel plasma source using a modified Penning discharge with a continuously moving substrate (moving in relation to the plasma). As the important features of a highly effective electron containment bottle and the closed drift containment nature of the source are understood, many embodiments of the fundamental source will be evident.

As has been explained, the magnetic and electric field arrangement, similar to a Penning discharge, effectively traps the electron Hall current in a region between two surfaces. When a substrate is positioned proximal to at least one of the electrodes and is moved relative to the plasma, the substrate is plasma treated, coated or otherwise modified depending upon the process gas used and the process pressure. This confinement arrangement produces dramatic results not resembling known prior art. Using this new source, many applications for PECVD, plasma etching, plasma treating, sputtering or other plasma processes will be substantial improved or made possible. In particular, applications using flexible webs are benefited. A summary of the web application benefits are:

A high efficiency plasma is created in a confined zone between two web-carrying conveyor rolls. In PECVD and other plasma processes, the surfaces receiving the coating or treatment are those in contact with or most proximal to the plasma. Since the web is the surface most proximal to the plasma, it receives the bulk of the coating, treatment, etc. This produces a more energy and materials efficient process as well as reduces wasteful coating on electrodes and shields.

The magnetic and electric field confinement geometry produces a symmetrical, endless racetrack confinement zone similar to a planar magnetron sputtering device or a closed drift ion source. As is known in these technologies, the length of the confinement zone can be extended to accommodate wide substrates while maintaining a uniform plasma. This is a major improvement over current RF or microwave discharges for large substrates at significantly less cost.

A magnetic field shaped into a racetrack is not required. This simplifies the overall mechanical and electrical assembly, reduces process gas requirements and makes adapting the source to different substrate shapes easier or in some cases, possible. This is done without requiring two parallel sources to cross feed each other or other complicating means such as a reversing electromagnetic field to contain Hall currents.

Similar to magnetron sputtering, the efficient plasma confinement allows operation at low pressures and voltages. Many process advantages are gained by this: Plasma does not light in other parts of the chamber or on electrode surfaces outside of the containment zone. The plasma is characteristically stable and uniform. Lower plasma voltage requirements make the power supplies safer and less costly. The free mean path is longer at lower pressure reducing powder formation in a PECVD process.

The gap between the substrate carrying surfaces can be made larger or smaller to change the magnetic or electric fields to produce more or less plasma penetration into the center between the facing surfaces.

While an intense plasma forms adjacent to the web substrate, the high energy ion bombardment of the substrate is less than magnetron type sources, such as the ones disclosed in U.S. Pat. No. 4,863,756 to Hartig et al. The result is a treatment or coating method that produces a high number of active particles with less substrate heating and less ablation of the substrate. Several significant advantages are gained by the option of low temperature operation of plasma processes: low temperature substrates can be used, extended contact with the plasma can be withstood without overheating and cost and complexity of water cooling may be eliminated in some applications.

These preferred embodiment significantly improve the plasma containment, allowing operation at lower pressures and voltages and reduces coating of non-substrate surfaces, as compared to some of the prior art.

As can be seen, the present invention offers significant advantages. While several embodiments have been depicted employing the inventive method, many more implementations will be evident to one skilled in the art. Finally, it should be noted that any of the alternatives discussed above can be used alone or in combination with one another. Some of these alternatives include:

Using unsymmetrical magnetic fields to focus ion flow to the less compressed end.

Configuring the electrodes to be one or both of the rolls supporting a web substrate.

Using a return magnetic field to strengthen the field in the gap, and using a shunt to collect stray field.

Placing the opposed electrode (anode) behind the substrate to shield it from coating.

Splitting the magnetic field and return magnetic field circuit through the center so that the outer "Penning discharge" forms a racetrack around the return center field.

Combining the racetrack Penning cell and two roll magnetrons facing each other.

Using a mirror magnetic field to assist at least one electrode with electron containment.

Using a source where the repulsion electrodes share the same power supply.

Using shaped magnetic fields to direct ion flow.

Moving the magnetic field relative to the substrate instead of moving the substrate relative to the magnetic field.

It is intended that the foregoing detailed description be understood as an illustration of selected forms that the invention can take and not as a definition of the invention. It is only the following claims, including all equivalents, that are intended to define the scope of this invention.

What is claimed is:

1. A plasma treatment apparatus comprising:
   at least two surfaces with a gap between the surfaces, wherein both surfaces are connected as electron confining electrodes;
   at least one magnetic field extending between the surfaces through the gap;
   at least one anode structure disposed around the at least one magnetic field creating diverging electric fields inside the at least one magnetic field to form a closed loop Hall current containment region within the at least one magnetic field, where upon with sufficient gas pressure and voltage between the electrodes and the anode structure, a plasma is formed in the containment region; and
   at least one continuously moving substrate positioned to be treated by the plasma, wherein the at least one continuously moving substrate is supported on at least one plasma facing surface and wherein at least one surface of the at least one continuously moving substrate is positioned between the plasma and the at least one plasma facing surface.

2. The invention of claim 1, wherein the at least one continuously moving substrate is positioned to be treated by the plasma with a treatment selected from the group consisting of: a chemical vapor deposition process, a sputter coating process, an ion etch process, a plasma surface modification process, and combinations thereof.

3. The invention of claim 1, wherein the magnetic field comprises a mirror magnetic field.

4. The invention of claim 1, wherein the at least one continuously moving substrate comprises a flexible web.

5. The invention of claim 1, wherein the at least one continuously moving substrate comprises a rigid planar substrate.

6. The invention of claim 1, wherein the at least one continuously moving substrate is supported on a roll.

7. The invention of claim 6, wherein the roll comprises one of the electrodes.

8. The invention of claim 7, wherein the at least one continuously moving substrate is also supported on a second roll, and wherein the second roll comprise the other of the electrodes.

9. The invention of claim 1, wherein the at least two surfaces are connected to a single power supply.

10. The invention of claim 1, wherein the at least two surfaces are connected to different power supplies.

11. The invention of claim 1, wherein the magnetic field is strong enough to magnetize electrons in at least a portion of the gap region.

12. The invention of claim 1, wherein the magnetic field is strong enough for ion containment.

13. The invention of claim 1, wherein the at least one continuously moving substrate is positioned around the at least one anode structure as to shield the at least one anode structure from plasma coating.

14. The invention of claim 1, wherein the at least two surfaces comprise two hollow electrode rolls, and wherein the at least one magnetic field is created, at least in part, by magnets internal to the rolls.

15. The invention of claim 1 further comprising a return magnetic field to strengthen the field in the gap and a shunt to collect stray field.

16. The invention of claim 15, wherein the apparatus is configured to provide a Penning discharge, wherein the magnetic field and the return magnetic field circuit are split through the center, and the Penning discharge forms a racetrack around the return center field.

17. The invention of claim 1 further comprising a racetrack Penning cell and two roll magnetrons facing each other.

18. A method for plasma treatment, the method comprising:
   (a) providing at least two surfaces with a gap between the surfaces, wherein both surfaces are connected as electron confining electrodes;
   (b) providing at least one magnetic field extending between the surfaces through the gap;
   (c) creating diverging electric fields inside the at least one magnetic field with at least one anode structure disposed around the at least one magnetic field, the diverging electric fields forming a closed loop Hall current containment region within the at least one magnetic field;
   (d) forming plasma in the containment region; and
   (e) treating a substrate with the plasma by performing at least one of the following: moving the substrate relative to the magnetic field or moving the magnetic field relative to the substrate.

19. The invention of claim 18, wherein the substrate is treated by the plasma with a treatment selected from the group consisting of: a chemical vapor deposition process, a sputter coating process, an ion etch process, a plasma surface modification process, and combinations thereof.

20. The invention of claim 18, wherein the magnetic field comprises a mirror magnetic field.

21. The invention of claim 18, wherein the substrate comprises a flexible web.

22. The invention of claim 18, wherein the substrate comprises a rigid planar substrate.

23. The invention of claim 18, wherein the substrate is supported on a roll.

24. The invention of claim 23, wherein the roll comprises one of the electrodes.

25. The invention of claim 24, wherein the substrate is also supported on a second roll, and wherein the second roll comprises the other of the electrodes.

26. The invention of claim 18, wherein the at least two surfaces are connected to a single power supply.

27. The invention of claim 18, wherein the at least two surfaces are connected to different power supplies.

28. The invention of claim 18, wherein the magnetic field is strong enough to magnetize electrons in at least a portion of the gap region.

29. The invention of claim 18, wherein the magnetic field is strong enough for ion containment.

30. The invention of claim 18, wherein the substrate is positioned around the at least one anode structure as to shield the at least one anode structure from plasma coating.

31. The invention of claim 18, wherein the at least two surfaces comprise two hollow electrode rolls, and wherein the at least one magnetic field is created, at least in part, by magnets internal to the rolls.

32. The invention of claim 18 further comprising strengthening the field in the gap with a return magnetic field and collecting stray field with a shunt.

33. The invention of claim 18 further comprising splitting the magnetic field and the return magnetic field circuit through the center and forming a racetrack with an outer Penning discharge around the return center field.

34. The invention of claim 18 further comprising providing a racetrack Penning cell and two roll magnetrons facing each other.

* * * * *